(12) United States Patent
Kim et al.

(10) Patent No.: US 10,468,572 B2
(45) Date of Patent: Nov. 5, 2019

(54) THERMOELECTRIC ELEMENT UNIT, THERMOELECTRIC MODULE INCLUDING THE SAME, AND METHOD FOR MANUFACTURING THE SAME

(71) Applicants: Hyundai Motor Company, Seoul (KR); Kia Motors Corporation, Seoul (KR)

(72) Inventors: Byung Wook Kim, Gyeonggi-do (KR); Jin Woo Kwak, Gyeongsangbuk-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/822,127

(22) Filed: Nov. 25, 2017

(65) Prior Publication Data

US 2019/0131506 A1   May 2, 2019

(30) Foreign Application Priority Data

Oct. 26, 2017   (KR) .................... 10-2017-0140470

(51) Int. Cl.
    *H01L 35/08*     (2006.01)
    *H01L 35/32*     (2006.01)
    *H01L 35/34*     (2006.01)
    *H01L 35/10*     (2006.01)
(52) U.S. Cl.
    CPC ............. *H01L 35/08* (2013.01); *H01L 35/10* (2013.01); *H01L 35/32* (2013.01); *H01L 35/34* (2013.01)

(58) Field of Classification Search
    CPC ......... H01L 35/08; H01L 35/10; H01L 35/32; H01L 35/34
    USPC ........................................................ 136/205
    See application file for complete search history.

(56) References Cited

U.S. PATENT DOCUMENTS

| 2007/0084497 | A1  | 4/2007  | Strnad |
| 2012/0167937 | A1  | 7/2012  | Fann et al. |
| 2012/0279541 | A1* | 11/2012 | Choi ........................ H01L 35/22 136/200 |
| 2013/0199590 | A1* | 8/2013  | Brueck ................... F01N 5/025 136/205 |
| 2014/0048115 | A1* | 2/2014  | Kirihara .................. G06F 3/041 136/229 |
| 2015/0214411 | A1* | 7/2015  | Guerra ................ H01L 31/0549 136/257 |
| 2015/0380630 | A1* | 12/2015 | Ishida ..................... H01L 37/00 136/205 |

FOREIGN PATENT DOCUMENTS

JP      2002-026406      1/2002

* cited by examiner

*Primary Examiner* — Jayne L Mershon
(74) *Attorney, Agent, or Firm* — Mintz Levin Cohn Ferris Glovsky and Popeo, P.C.; Peter F. Corless

(57) ABSTRACT

A thermoelectric element unit is provided. The thermoelectric element unit includes a plurality of thermoelectric elements and a plurality of electrodes embedded in each of the thermoelectric elements by a predetermined number. Additionally, at least one of the plurality of electrodes includes a terminal part that protrudes to an exterior of the thermoelectric element having the at least one electrode embedded among the thermoelectric elements.

13 Claims, 21 Drawing Sheets

THERMOELECTRIC ELEMENT UNIT, THERMOELECTRIC MODULE INCLUDING THE SAME, AND METHOD FOR MANUFACTURING THE SAME

CROSS-REFERENCE TO RELATED APPLICATION

This application is based on and claims the benefit of priority to Korean Patent Application No. 10-2017-0140470, filed on Oct. 26, 2017, the disclosure of which is incorporated herein in its entirety by reference.

TECHNICAL FIELD

The present disclosure relates to a thermoelectric element unit a thermoelectric module including the same, and a method for manufacturing the same and more particularly, to a thermoelectric element that prevents a thermoelectric module from being damaged due to a difference in a coefficient of expansion between a thermoelectric element and an electrode.

BACKGROUND

Recently, a usage amount of a thermoelectric module capable of recovering waste heat discharged from an apparatus such as a vehicle using the Seebeck effect that generates an electromotive force by a temperature difference across a thermoelectric element has been increased. A conventional thermoelectric module includes an N-type thermoelectric element and a P-type thermoelectric element which are arranged alternately with opposite polarities. In particular, electrodes electrically connect the thermoelectric elements with each other and a bonding layer is interposed between the thermoelectric element and the electrode to bond the thermoelectric element and the electrode, and the like.

However, the thermoelectric element and the electrode generally have different coefficients of expansion. For example, when the thermoelectric element and the electrode are thermally expanded at different ratios during the use of the thermoelectric module the thermal stress acts on the bonding layer interposed between the thermoelectric element and the electrode. Accordingly, the conventional thermoelectric module suffers deterioration of the performance of the thermoelectric module or the thermoelectric module may not be frequently used since the bonding layer is damaged by the thermal stress.

The above information disclosed in this section is merely for enhancement of understanding of the background of the disclosure and therefore it may contain information that does not form the prior art that is already known in this country to a person of ordinary skill in the art.

SUMMARY

The present disclosure provides a thermoelectric element unit which is improved to prevent a thermoelectric module from being damaged due to a difference in a coefficient of expansion between a thermoelectric element and an electrode, a thermoelectric module including the same, and a method for manufacturing the same.

In an aspect of an exemplary embodiment of the present disclosure, a thermoelectric element unit may include a thermoelectric element, and an electrode having a terminal part that protrudes to an exterior of the thermoelectric element and embedded in the thermoelectric element. The electrode may have a rod shape elongated in a length direction and may be disposed to penetrate through the thermoelectric element along the length direction. The thermoelectric element may be formed of a thermoelectric material sintered body having a predetermined sintering temperature, and the electrode may be formed of an electrode material having a melting temperature greater than the sintering temperature.

According to another aspect of an exemplary embodiment of the present disclosure, a thermoelectric module may include a plurality of thermoelectric elements and a plurality of electrodes embedded in each of the thermoelectric elements by a predetermined number. In particular, at least one of the plurality of electrodes may include a terminal part that protrudes to an exterior of the thermoelectric element having the at least one electrode embedded among the thermoelectric elements. Each of the thermoelectric elements may be formed of a thermoelectric material sintered body having a predetermined sintering temperature, and each of the electrodes may be formed of an electrode material having a melting temperature greater than the sintering temperature.

In some exemplary embodiments, the electrodes may be electrically connected to each other by a connection between the terminal part of any one electrode of the electrodes and the terminal part of a different electrode of the electrodes. The thermoelectric module may further include a connection member configured to electrically connect the terminal part of the any one electrode with the terminal part of a different electrode. The connection member may include a female connector mounted on the terminal part of the any one electrode and a male connector mounted on the terminal part of the different electrode and selectively coupled to the female connector. In other exemplary embodiments, the connection member may include a first elastic hook elastically coupled to the terminal part of the any one electrode, a second elastic hook elastically coupled to the terminal part of the different electrode, and a connecting part that electrically connects the first elastic hook and the second elastic hook with each other.

In other exemplary embodiments, the electrodes embedded together in the same thermoelectric element among the thermoelectric elements may be disposed to enable at least portions of the electrodes to be contact with each other. The electrodes embedded together in the same thermoelectric element among the thermoelectric may be disposed in a mesh shape. In particular, each of the electrodes may have a rod shape elongated in a length direction and may be disposed to penetrate through the thermoelectric element in which the electrode is embedded among the thermoelectric elements in the length direction. The thermoelectric module may further include an insulating layer disposed on an exterior side surface of at least one of the thermoelectric elements.

In another aspect of an exemplary embodiment of the present disclosure, a method for manufacturing a thermoelectric element unit may include stacking a thermoelectric material powder and electrodes to embed the electrodes in the thermoelectric material powder and forming a thermoelectric element formed of a thermoelectric material sintered body formed by sintering the thermoelectric material powder and having the electrodes embedded therein.

In some exemplary embodiments, the stacking of the thermoelectric material powder and the electrodes may be performed to position at least one end portion of opposite end portions of the electrode to protrude to an exterior of the thermoelectric material powder. The thermoelectric material powder may have a sintering temperature less than a melting temperature of the electrode, and the forming of the thermoelectric element may be performed at an ambient temperature less than the melting temperature. The stacking of the thermoelectric material powder and the electrodes may include filling the thermoelectric material powder in a lower mold to a predetermined height and seating the electrodes on predetermined positions of the lower mold, mounting an upper mold on the lower mold and filling the thermoelectric material powder in the upper mold to a predetermined height to embed the electrodes in the thermoelectric material powder.

In some exemplary embodiments, the lower mold may include holding grooves to maintain the position of the electrodes and the filling of the thermoelectric material powder in the lower mold may be performed by maintaining the position of the electrodes in the holding grooves. The upper mole may include fixing protrusions inserted into the holding grooves and the mounting of the upper mold on the lower mold may be performed by inserting the fixing protrusions into the holding grooves to maintain the position of the electrodes. The method may further include, after the forming of the thermoelectric element separating the lower mold and the upper mold from the thermoelectric element and the electrodes.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
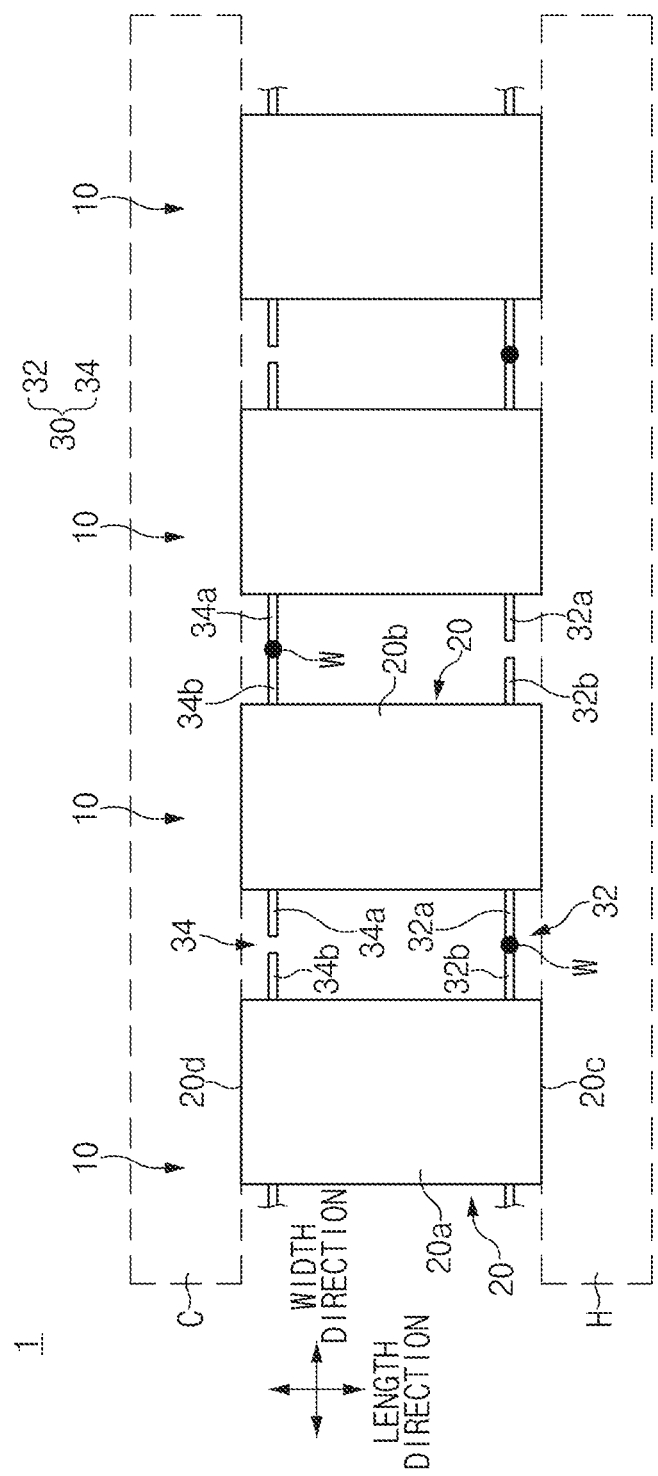
FIG. 1 is an exemplary front view illustrating a schematic configuration of a thermoelectric module according to a first exemplary embodiment of the present disclosure.

Hereinafter, some exemplary embodiments of the present disclosure will be described in detail with reference to the illustrative drawings. It is to be noted that in giving reference numerals to components of each of the accompanying drawings, the same components will be denoted by the same reference numerals even though they are shown in different drawings. Further, in describing exemplary embodiments of the present disclosure, well-known constructions or functions will not be described in detail in the case in which they may unnecessarily obscure the understanding of the exemplary embodiments of the present disclosure.

In describing the components of exemplary embodiments of the present disclosure, terms such as first, second, A, B, (a), (b), etc. may be used. These terms are used only to differentiate the components from other components. Therefore, the nature, order, sequence, etc. of the corresponding components are not limited by these terms. In addition, unless defined otherwise, it is to be understood that all the terms used in the specification including technical and scientific terms have the same meaning as those that are understood by those skilled in the art. It should be understood that the terms defined by the dictionary are identical with the meanings within the context of the related art, and they should not be ideally or excessively formally construed unless clearly defined otherwise in the present application.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term) "and/or" includes any and all combinations of one or more of the associated listed items. As used herein, the term "and/or" includes any and all combinations of one or more of the associated listed items. For example, in order to make the description of the present disclosure clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

Unless specifically stated or obvious from context, as used herein, the term) "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the tem) "about."

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

Figure 2:
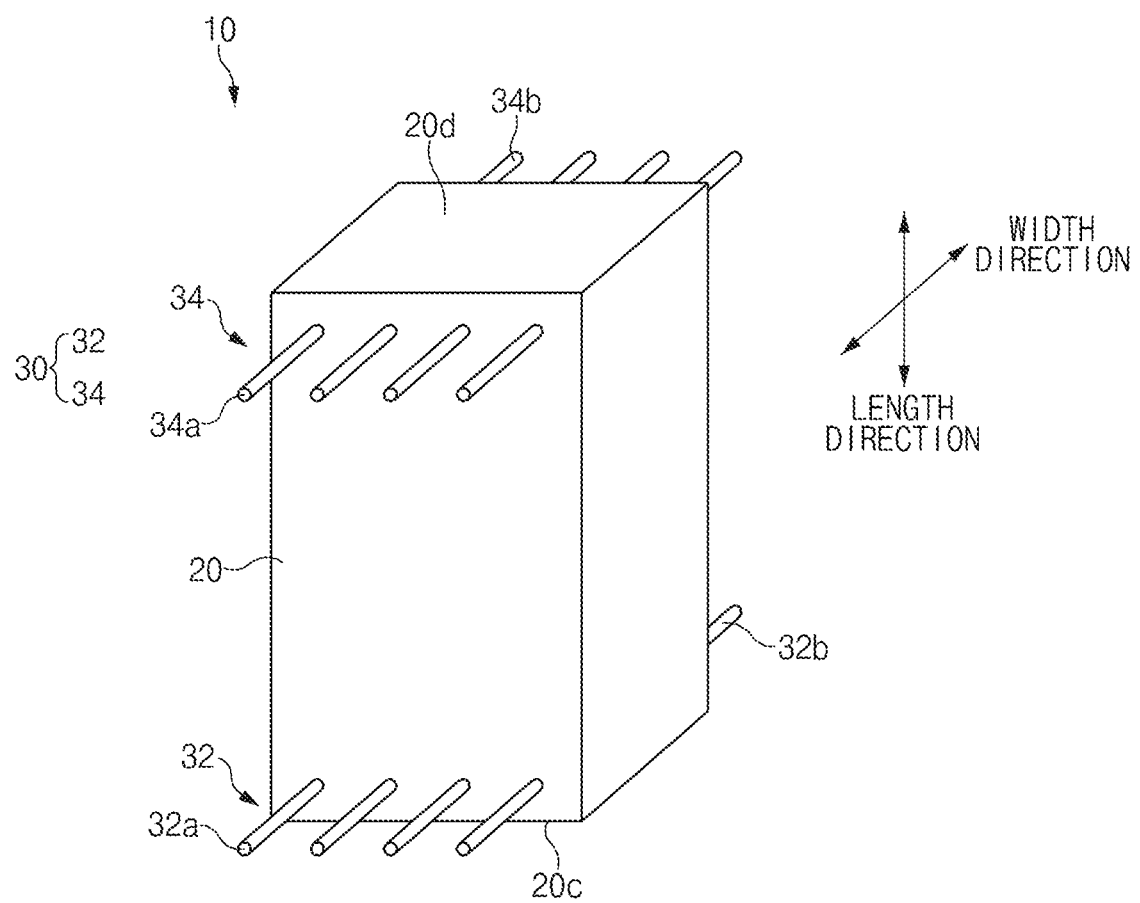
FIG. 2 is an exemplary perspective view of a thermoelectric element unit illustrated in FIG. 1 accordingly to an exemplary embodiment of the present disclosure.
Figure 3:
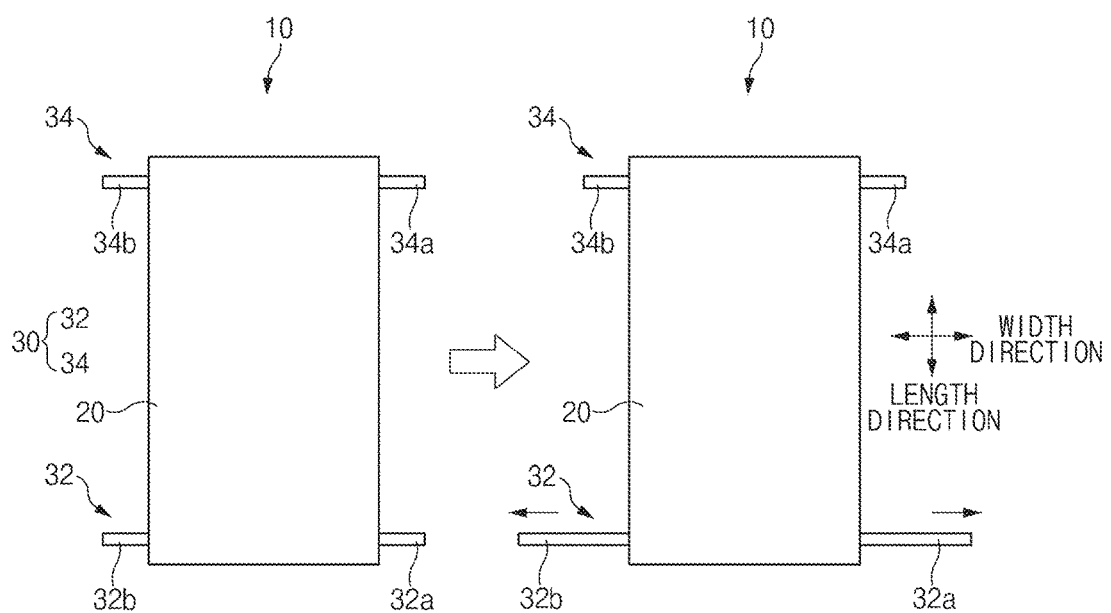
FIG. 3 is an exemplary view illustrating an aspect in which an electrode illustrated in FIG. 2 is thermally expanded accordingly to an exemplary embodiment of the present disclosure.

FIG. 1 is an exemplary front view illustrating a schematic configuration of a thermoelectric module according to a first exemplary embodiment of the present disclosure. FIG. 2 is an exemplary perspective view of a thermoelectric element unit illustrated in FIG. 1. FIG. 3 is an exemplary view illustrating an aspect in which an electrode illustrated in FIG. 2 is thermally expanded. In FIGS. 1 to 3, a length direction refers to a length direction of a thermoelectric element 20 and a width direction refers to a width direction of the thermoelectric element 20.

Referring to FIG. 1, a thermoelectric module 1 according to a first exemplary embodiment of the present disclosure may include a plurality of thermoelectric element units 10 which are electrically connected with each other. The thermoelectric element unit 10 may include a unit body in which the thermoelectric element 20 and an electrode 30 are integrally coupled with each other. For convenience of explanation, hereinafter, such a thermoelectric element unit 10 is described and the thermoelectric module 1 will be then described.

As illustrated in FIG. 2, the thermoelectric element unit 10 may include the thermoelectric element 20 and at least one electrode 30 embedded in the thermoelectric element 20. The thermoelectric element 20 may be formed from a thermoelectric material sintered body formed by sintering a thermoelectric material powder P. In particular, a thermoelectric element 20 may be formed from a thermoelectric material having a sintering temperature less than a melting temperature of the electrode 30 to be described below. For example, the thermoelectric element 20 may be formed from a thermoelectric material such as a silicide-based thermoelectric material, a skutterudites-based thermoelectric material, a BiTe-based thermoelectric material, or the like.

As illustrated in FIG. 1, the thermoelectric element 20 may include a first thermoelectric element 20a and a second thermoelectric element 20b having opposite polarities. For example, when the first thermoelectric element 20a is an N-type thermoelectric element 20, the second thermoelectric element 20b may be a P-type thermoelectric element, and when the first thermoelectric element 20a is the P-type thermoelectric element 20, the second thermoelectric element 20b may be the N-type thermoelectric element. As illustrated in FIG. 1, the first thermoelectric element 20a and second thermoelectric element 20b may be disposed alternately along a width direction of the thermoelectric element 20 while having a predetermined interval therebetween.

The electrode 30 may have a rod shape elongated along a length direction of the electrode 30. As illustrated in FIG. 1, an electrode 30 may be embedded in the thermoelectric element 20 to penetrate through the thermoelectric element 20 along the length direction of the electrode 30, that is, the width direction of the thermoelectric element 20. Accordingly, when the electrode 30 is supported and fixed by the thermoelectric element 20, the electrode 30 may be disposed at a predefined position without using a separate bonding material for bonding the electrode 30 and the thermoelectric element 20 to each other.

As illustrated in FIG. 2, the electrode 30 may be disposed to position end portions of opposite sides thereof to each protrude to the exterior through different exterior side surfaces of the thermoelectric element 20 by a predetermined length. However, the electrode 30 is not limited thereto, but the electrode 30 may also be disposed to enable an end portion of one side of the end portions of the opposite sides thereof protrudes to the exterior of the thermoelectric element 20. Accordingly, the end portions of the electrode 30 protruded to the exterior of the thermoelectric element 20 may form terminals for electrically connecting the electrodes 30 with each other or connecting the electrodes 30 with an external electrical device. For convenience of explanation, hereinafter, the end portions of one side of the electrode 30 protruded to the exterior through one surface of the thermoelectric element 20 are referred as first terminal parts 32a and 34a, and the end portions of the other side of the electrode 30 protruded to the exterior through the other surface of the thermoelectric element 20 are referred as second terminal parts 32b and 34b. The number of the electrodes 30 to be installed is not particularly limited, and the electrodes 30 may be embedded in the thermoelectric element 20 by a predetermined number. For example, different numbers of the electrodes 30 may be embedded in the respective thermoelectric elements 20.

An installation position of an electrode 30 is not particularly limited. For example, as illustrated in FIG. 2, a first electrode 30 may be disposed to be adjacent to an end portion 20c of a heat source side of the thermoelectric element 20, and a second electrode 30 may be disposed to be adjacent to an end portion 20d of a cool source side of the thermoelectric element 20. Referring to FIG. 1, the end portion 20c of the heat source side of the thermoelectric element 20, which is an end portion of a first side of the thermoelectric element 20 disposed to be thermally in contact with a heat source H, may correspond to a heat absorbing part configured to absorb heat discharged from the heat source H. Further, the end portion 20d of the cool source side of the thermoelectric element 20, which is an end portion of the second side of the thermoelectric element 20 may be disposed to be thermally in contact with a cool source C, corresponds to a heat radiating part configured to transfer the heat absorbed by the thermoelectric element 20 to the cool source C. For convenience of explanation, hereinafter, some electrodes 30 disposed to be adjacent to the end portion 20c of the heat source side of the thermoelectric element 20 are referred to as a first electrode 32, and other electrodes 30 disposed to be adjacent to the end portion 20d of the cool source side of the thermoelectric element 20 are referred to as a second electrode 34.

An electrode 30 may be formed of a material having a melting temperature less than a sintering temperature of a thermoelectric material that forms the thermoelectric element 20. For example, the electrode 30 may be formed of any one material of copper (Cu), nickel (Ni), carbon (C), titanium (Ti), tungsten (W), silver (Ag), platinum (Pt), and palladium (Pd) or an alloy of two or more materials of the above-mentioned materials. Accordingly, when the thermoelectric material powder P is sintered when the electrode 30 which is formed in advance is embedded in the thermoelectric material powder P for forming the thermoelectric element 20, an alloy is not formed on an interface between the electrode 30 and the thermoelectric element 20. Therefore, the electrode 30 may be physically independent from the thermoelectric element 20 even in the state in which it is embedded in the thermoelectric element 20. Therefore, during an actual use of the thermoelectric module 1, the thermoelectric element 20 and the electrode 30 may be each thermally expanded independently of each other by a ratio that corresponds to a coefficient of expansion in a state when they do not interfere with each other.

As illustrated in FIG. 1, the thermoelectric element units 10 may be disposed at a predetermined interval along the width direction of the thermoelectric element 20 to position the electrodes 32 and 34 of the same type on the same line. As illustrated in FIG. 1, the thermoelectric module 1 may be provided so that the plurality of thermoelectric element units 10 are electrically connected with each other according to a predetermined connection method. In other words, the thermoelectric module 1 may electrically connect the plurality of thermoelectric element units 10 with each other according to at least one connection method of a series and a parallel.

As illustrated in FIG. 1, the electrode 30 of one thermoelectric element unit 10 and the electrode 30 of a different thermoelectric element unit 10 among a pair of thermoelectric element units 10 disposed to be adjacent to each other may be electrically connected with each other. For example, when the plurality of thermoelectric element units 10 are connected in series with each other, the electrodes 30 of the same type may be electrically connected with each other. The first electrodes 32 and the second electrodes 34 may be alternately and electrically connected with each other along the width direction of the thermoelectric element 20. For example, as illustrated in FIG. 1, the first electrode 32 of one thermoelectric element unit 10 and the first electrode 32 of a different thermoelectric element unit 10 adjacent to the first thermoelectric element unit 10 may be connected with each other, and the second electrode 34 of the a thermoelectric element unit 10 and the second electrode 34 of the different thermoelectric element unit 10 adjacent to another thermoelectric element unit 10 may be electrically connected with each other.

A method for electrically connecting the electrodes 30 is not particularly limited thereto. For example, the electrodes 30 may be electrically connected with each other by connecting between the terminal parts 32a, 32b, 34a, and 34b. In particular, the terminal parts 32a, 32b, 34a, and 34b of the electrodes 30 electrically connected may be connected with each other by welding or the like. In FIG. 1, reference numeral 'W' denotes a weld bead formed when the terminal parts 32a, 32b, 34a, and 34b are welded. However, when the terminal parts 32a, 32b, 34a, and 34b which are not welded to each other are in contact with each other due to vibration or other causes, performance of the thermoelectric module 1 may be deteriorated due to a short circuit formed between the terminal parts 32a, 32b, 34a, and 34b which are not welded to each other. Accordingly, the terminal parts 32a, 32b, 34a, and 34b of the electrode 30 to be electrically disconnected from an adjacent electrode 30 among the electrodes 30 may be short-trimmed to prevent contact with the terminal parts 32a, 32b, 34a, and 34b of the adjacent electrode 30.

As illustrated in FIG. 1, a thermoelectric module 1 may be disposed to position the end portion 20c of the heat source side of each of the thermoelectric elements 20 to be thermally in contact with the heat source H and the end portion 20d of the cool source side of the each of the thermoelectric elements 20 may be thermally in contact with the cool source C. The type of the heat source H and the cool source C is not particularly limited. For example, the heat source H may be an exhaust pipe or an exhaust manifold of a vehicle, and the cool source C may be a coolant jacket of the vehicle. Accordingly, the thermoelectric module 1 may be configured to generate an electromotive force which is proportional to a temperature difference between the end portion 20c of the heat source side and the end portion 20d of the cool source side and may be configured to supply it to an external electric device such as a battery through the electrodes 30.

During an actual use of such a thermoelectric module 1, the electrodes 30 may be thermally expanded by heat transferred from the thermoelectric element 20 or heat transferred directly from the exterior. In particular, the first electrode 32 disposed to be adjacent to the end portion 20c of the heat source side of the thermoelectric element 20 may be thermally expanded by a ratio greater than the second electrode 34 disposed adjacent to the end portion 20d of the cool source side of the thermoelectric element 20, due to heat of high temperature supplied from the heat source H. However, as described above, the electrodes 30 may have the elongated rod shape and may be thermally expanded independently of each other when they do not interfere with the thermoelectric element 20.

Therefore, as illustrated in FIG. 3, during the actual use of the thermoelectric module 1, the electrodes 30 are mainly thermally expanded in the length direction of the electrodes 30, (e.g., the width direction of the thermoelectric element 20) and an additional length increment of the electrodes 30 may be configured to slidably move along the interfaces between the electrodes 30 and the thermoelectric element 20 and additionally protrude to the exterior of the thermoelectric element 20. Therefore, according to the thermoelectric module 1, when the thermal stress acting between the electrodes 30 and the thermoelectric element 20 during thermal expansion of the electrodes 30 is minimized, the performance of the thermoelectric module 1 may be prevented from being deteriorated or the thermoelectric module 1 may be prevented from being damaged by the thermal stress.

Further, when the thermoelectric module 1 has a structure in which the electrodes 30 are embedded in the thermoelectric element 20, an insulating substrate for insulating the electrodes 30 from the exterior may not be required to be installed. Therefore, the thermoelectric module 1 may reduce heat loss due to the insulating substrate compared to the conventional thermoelectric module when the installation of the insulating substrate is required, thereby improving thermoelectric conversion efficiency.

Further, when the electrodes 30 have the elongated rod shape, the thermoelectric module 1 has a structure to impart flexibility to the electrodes 30 compared to the conventional thermoelectric module in which the electrodes have a plate shape. Therefore, the thermoelectric module 1 may be applied to a device having a curved surface shape using flexibility of the electrodes 30. Further, when the thermoelectric module 1 is applied to the device having the curved surface shape, the electrodes 30 may be connected with each other by welding or other connection methods to form a predetermined included angle.

Figure 4:
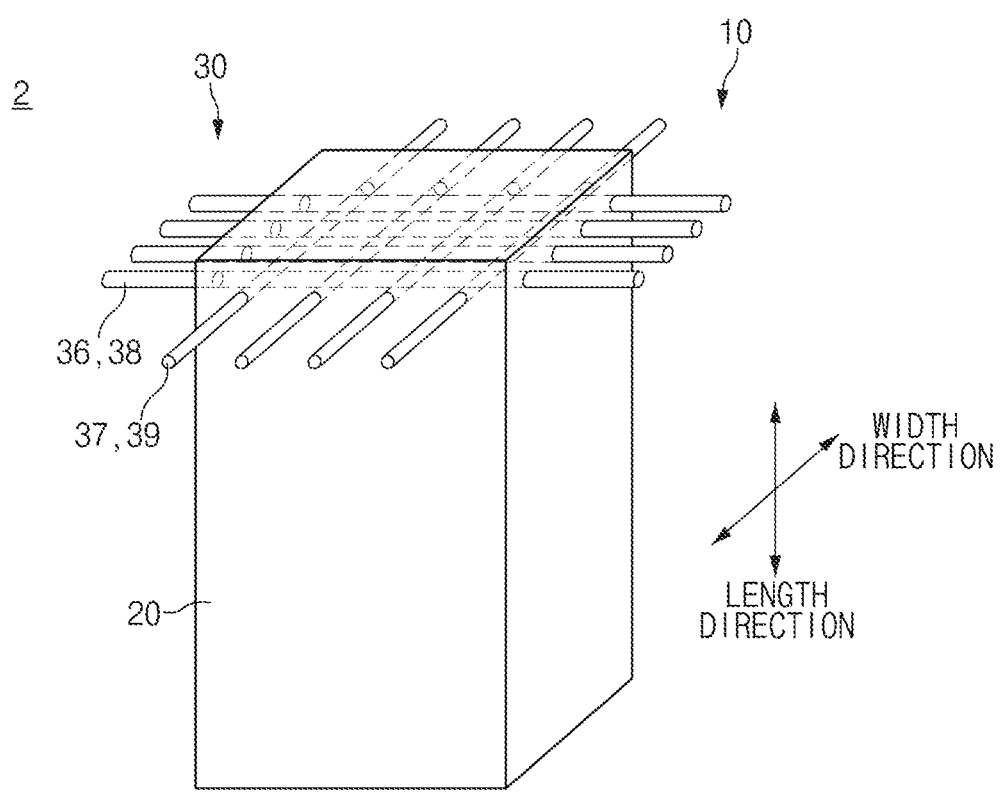
FIG. 4 is an exemplary perspective view of a thermoelectric element unit included in a thermoelectric module according to a second exemplary embodiment of the present disclosure.
Figure 5:
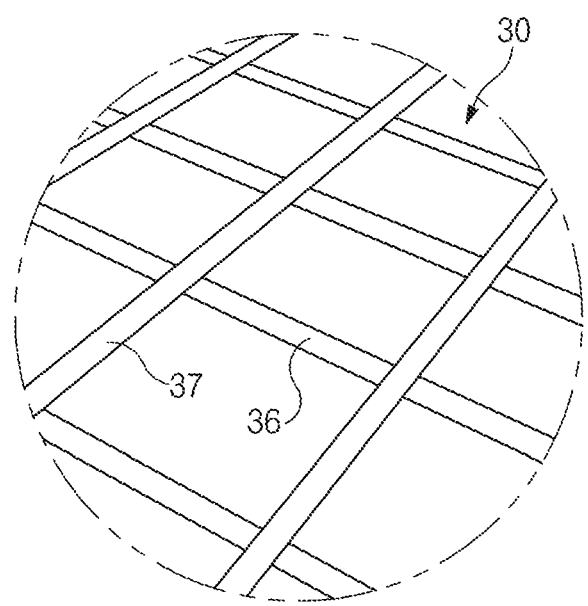
FIG. 5 is an exemplary view illustrating one aspect in which electrodes illustrated in FIG. 4 are stacked in a mesh shape according to an exemplary embodiment of the present disclosure.
Figure 6:
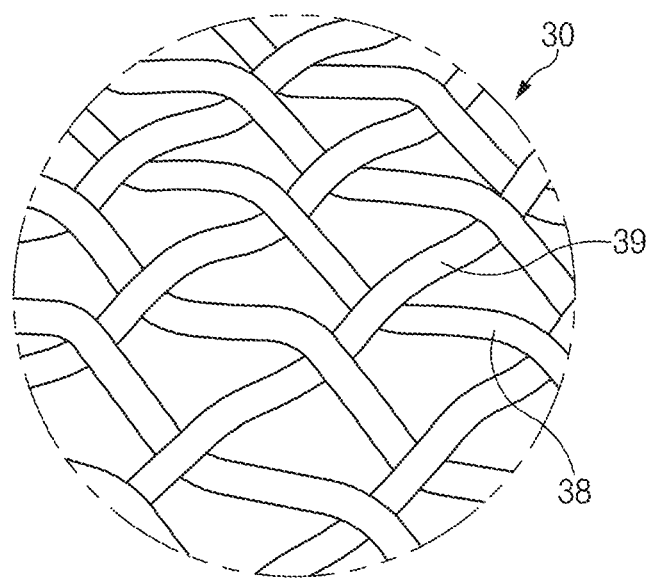
FIG. 6 is an exemplary view illustrating another aspect in which electrodes illustrated in FIG. 4 are stacked in a mesh shape according to an exemplary embodiment of the present disclosure.

FIG. 4 is an exemplary perspective view of a thermoelectric element unit included in a thermoelectric module according to a second exemplary embodiment of the present disclosure. FIG. 5 is an exemplary view illustrating one aspect in which electrodes illustrated in FIG. 4 are stacked in a mesh shape. FIG. 6 is an exemplary view illustrating another aspect in which electrodes illustrated in FIG. 4 are stacked in a mesh shape. A thermoelectric module 2 according to a second exemplary embodiment of the present disclosure differs from the thermoelectric module 1 described above in that a method for disposing the electrodes 30 is different.

The electrodes 30 which are together embedded in any one thermoelectric element 20 may be disposed to enable at least a portion thereof to be in contact with each other to have the same potential as each other. For example, as illustrated in FIG. 4, the electrodes 30 which are together embedded in any one thermoelectric element 20 may be disposed in a mesh shape. Accordingly, when the electrodes 30 are disposed in the mesh shape, a contact area between the electrodes 30 and the thermoelectric element 20 may be increased compared to when the electrodes 30 are disposed in one direction and contact resistance between the electrodes 30 and the thermoelectric element 20 may be reduced. A method for disposing the electrodes 30 in the mesh shape is not particularly limited. For example, as illustrated in FIG. 5, the electrodes 30 may include third electrodes 36 aligned in one direction which is predetermined and fourth electrodes 37 aligned in the other direction forming a predetermined angle with the one direction to be overlapped with the third electrodes 36 (a fast method).

For example, as illustrated in FIG. 6, the electrodes 30 may include fifth electrodes 38 and sixth electrodes 39 which are woven to be twisted with each other (a second method). According to the first method, to maintain a contact state between the third electrodes 36 and the fourth electrodes 37, the third electrodes 36 and the fourth electrodes 37 may be bonded to each other by welding or other methods. Additionally, when the third electrodes 36 and the fourth electrodes 37 are bonded to each other, the thermal stress may act between the electrodes 30 and the thermoelectric element 20 due to distortion occurring at bonded portions between the third electrodes 36 and the fourth electrodes 37 during thermal expansion of the third electrodes 36 and the fourth electrodes 37. According to the second method, however, when the fifth electrodes 38 and the sixth electrodes 39 are in press-contact with each other due to the weaving, the contact state between the fifth electrodes 38 and the sixth electrodes 39 may be more stably maintained even though the fifth electrodes 38 and the sixth electrodes 39 are separately bonded to each other. Therefore, according to the second method, the thermal stress acting between the electrodes 30 and the thermoelectric element 20 may be reduced.

Figure 7:
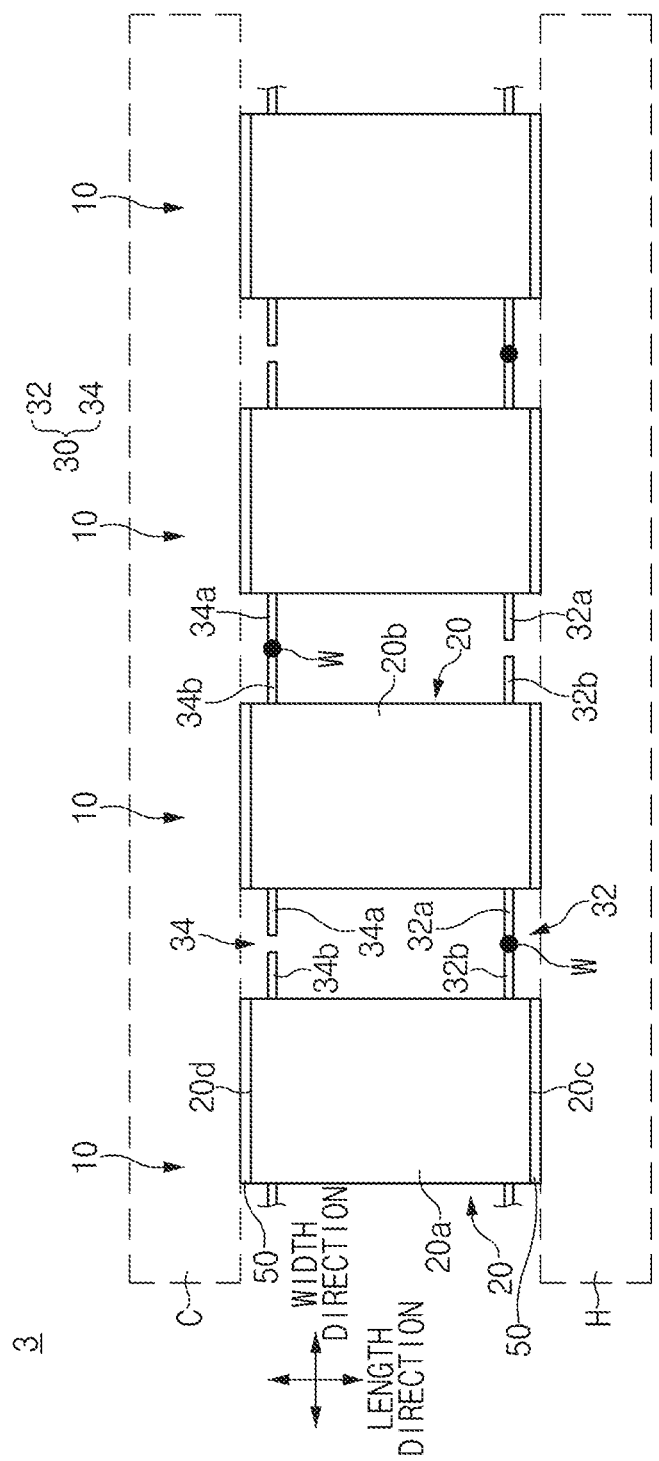
FIG. 7 is an exemplary front view illustrating a schematic configuration of a thermoelectric module according to a third exemplary embodiment of the present disclosure.

FIG. 7 is an exemplary front view illustrating a schematic configuration of a thermoelectric module according to a third exemplary embodiment of the present disclosure. A thermoelectric module 3 according to a third exemplary embodiment of the present disclosure differs from the thermoelectric module 1 and may further include an insulating layer 50 for insulating the thermoelectric module 3. The insulating layer 50 may be disposed between the end portion 20c of the heat source side of the thermoelectric element 20 and the heat source H, or between the end portion 20d of the cool source side of the thermoelectric element 20 and the cool source C, as illustrated in FIG. 7. The insulating layer 50 may be formed of ceramic or other insulating materials. A method for forming the insulating layer 50 is not particularly limited. For example, the insulating layer 50 may be formed by a method including puttering, e-beam evaporation, thermal spraying, or the like. By inclusion of the insulating layer 50, the thermoelectric elements 20 may be insulated from an external device such as the heat source H, the cool source C, or the like.

Figure 8:
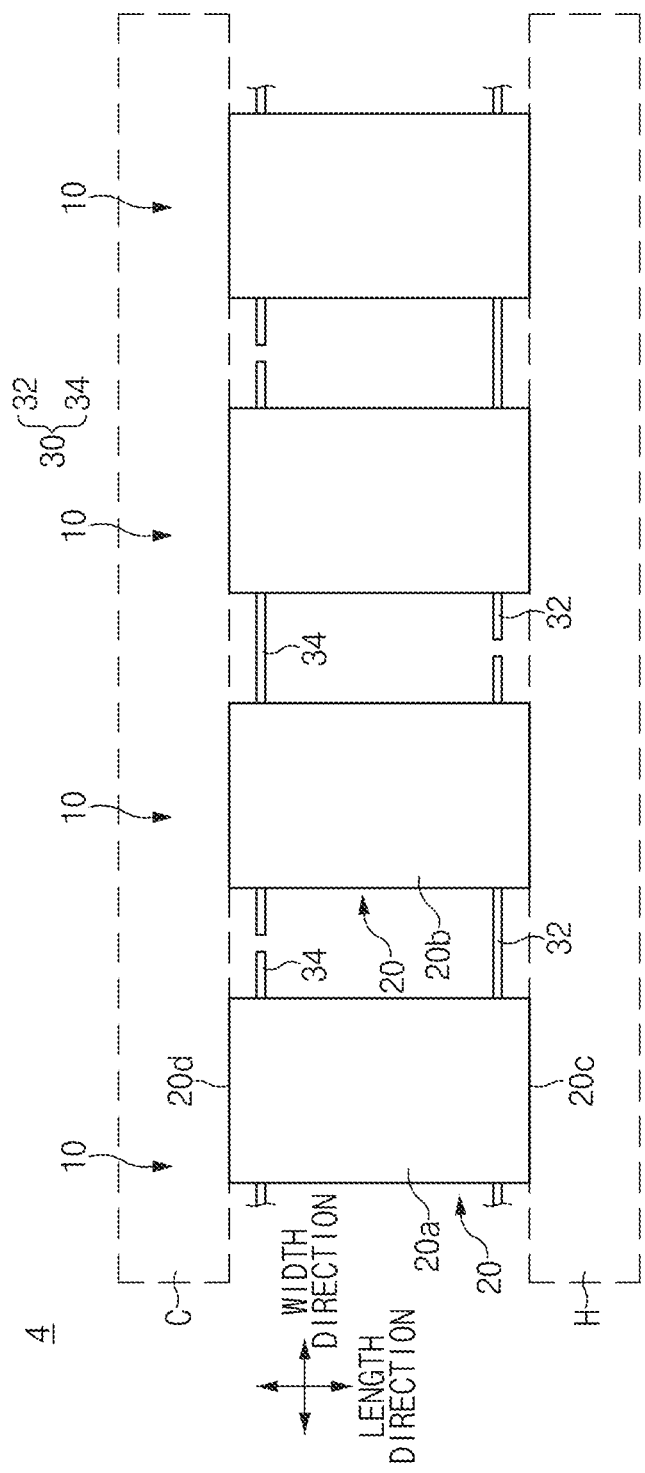
FIG. 8 is an exemplary front view illustrating a schematic configuration of a thermoelectric module according to a fourth exemplary embodiment of the present disclosure.

FIG. 8 is an exemplary front view illustrating a schematic configuration of a thermoelectric module according to a fourth exemplary embodiment of the present disclosure. A thermoelectric module 4 according to a fourth exemplary embodiment of the present disclosure differs from the thermoelectric module 1 described above in a structure in which the electrode 30 is installed.

As illustrated in FIG. 8, the electrode 30 may be disposed to penetrate through a pair of thermoelectric elements 20 having opposite polarities and disposed to be adjacent to each other in the width direction. For example, the first electrode 32 may penetrate through the first thermoelectric element 20a and the second thermoelectric element 20b disposed to be adjacent to each other in the width direction of the thermoelectric element 20, positioned to be adjacent to the end portion 20c of the heat source side of the thermoelectric element 20. For example, the second electrode 34 may penetrate through the first thermoelectric element 20a and the second thermoelectric element 20b disposed to be adjacent to each other in the width direction of the thermoelectric element 20, positioned to be adjacent to the end portion 20d of the cool source side of the thermoelectric element 20. Accordingly, a structure having the first electrode 32 and the second electrode 34 disposed as described may enable the thermoelectric elements 20 to be more easily electrically connected to each other using the electrode 30 without using a separate connection member 40.

Figure 9:
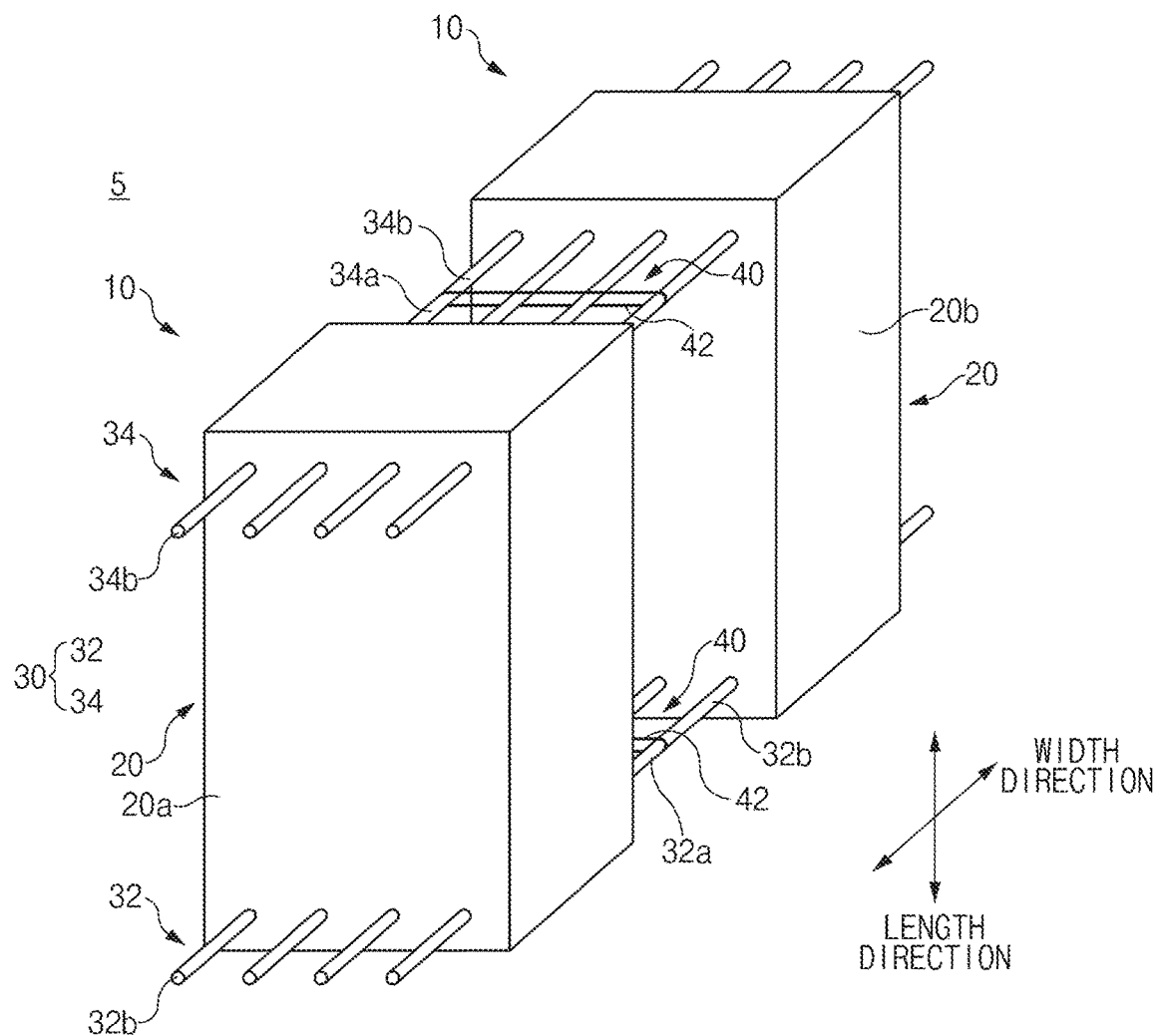
FIG. 9 is an exemplary perspective view of a thermoelectric element unit included in a thermoelectric module according to a fifth exemplary embodiment of the present disclosure.

FIG. 9 is an exemplary perspective view of a thermoelectric element unit included in a thermoelectric module according to a fifth exemplary embodiment of the present disclosure. A thermoelectric module 5 according to a fifth exemplary embodiment of the present disclosure differs from the thermoelectric module 1 having the electrodes 30 connected to each other by the welding by further including a connection member 40 for electrically connecting the electrodes 30 with each other.

A structure of the connection member 40 is not particularly limited. For example, as illustrated in FIG. 9, the connection member 40 may be a wire 42 wound on an overlapped portion in which the first terminal parts 32a and 34a of the electrode 30 of any one thermoelectric element unit 10 and the second terminal parts 32b and 34b of the electrode 30 of the other thermoelectric element unit 10 adjacent to any one thermoelectric element unit 10 are overlapped with each other. Accordingly, a wire 42 may be wound to simultaneously enclose outer circumference surfaces of the plurality of electrodes 30. The wire 42 may electrically connect the electrodes 30 with each other and may remove a potential difference between the electrodes 30 to provide the electrodes 30 with the same potential.

Figure 10:
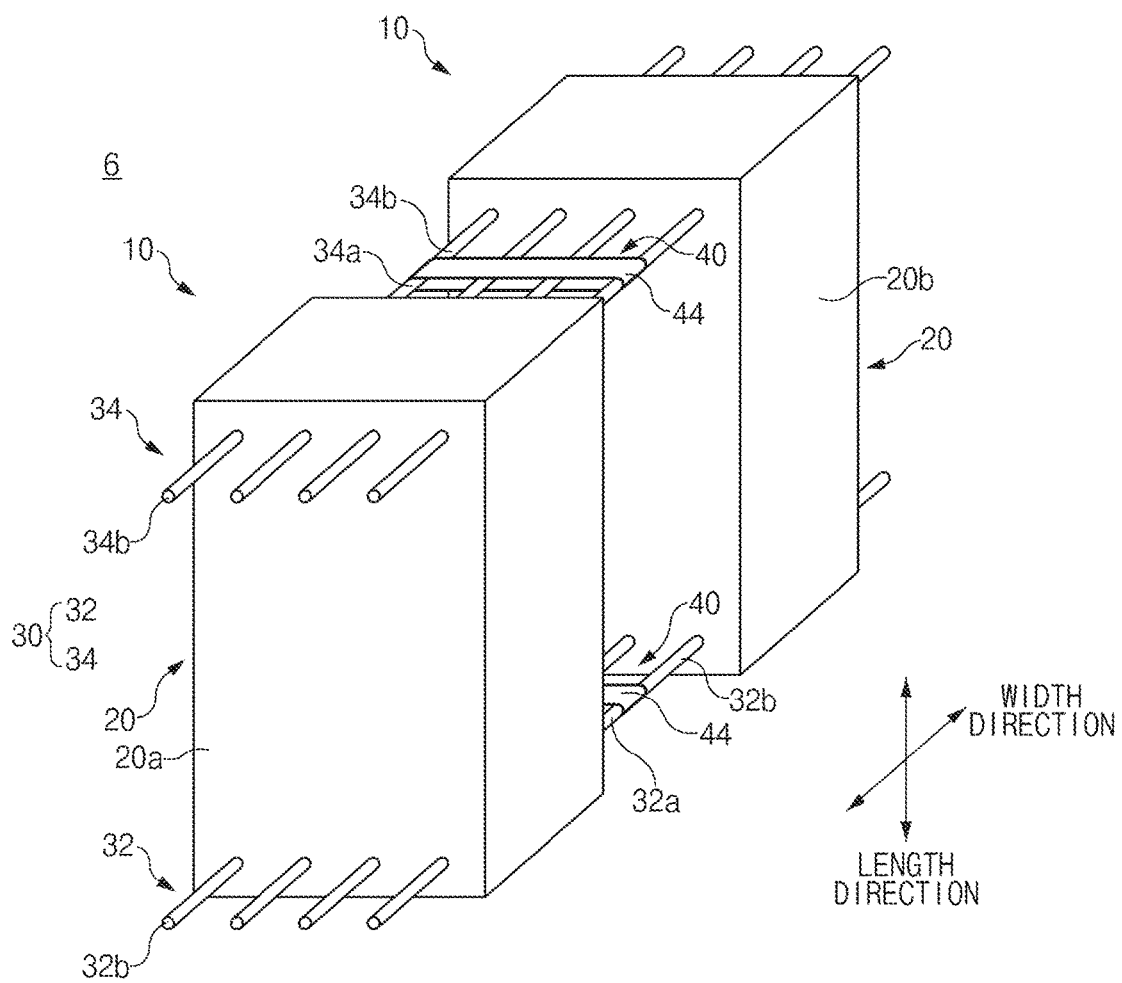
FIG. 10 is an exemplary perspective view of a thermoelectric element unit included in a thermoelectric module according to a sixth exemplary embodiment of the present disclosure.

FIG. 10 is an exemplary perspective view of a thermoelectric element unit included in a thermoelectric module according to a sixth exemplary embodiment of the present disclosure. A thermoelectric module 6 according to a sixth exemplary embodiment of the present disclosure differs from the thermoelectric module 5 described above by having a different the structure of the connection member 40. As illustrated in FIG. 10, the connection member 40 may be a conductor tape 44 coupled to an overlapped portion in which the East terminal parts 32a and 34a of the electrode 30 of any one thermoelectric element unit 10 and the second terminal parts 32b and 34b of the electrode 30 of the other thermoelectric element unit 10 adjacent to any one thermoelectric element unit 10 are overlapped with each other. Accordingly, a wire 42 may be coupled to the electrodes 30 to simultaneously enclose outer circumference surfaces of the plurality of electrodes 30. The wire 42 may electrically connect the electrodes 30 with each other and may remove a potential difference between the electrodes 30 to provide the electrodes 30 with the same potential.

Figure 11:
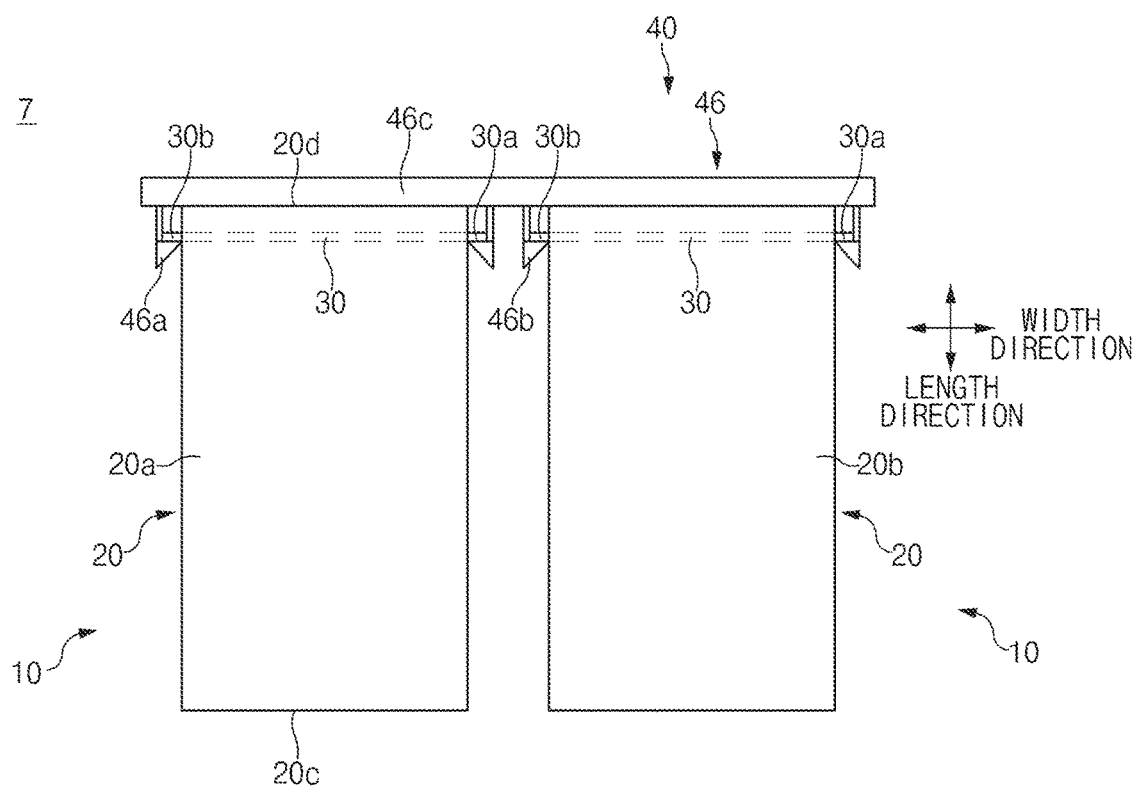
FIG. 11 is an exemplary front view of a thermoelectric element unit included in a thermoelectric module according to a seventh exemplary embodiment of the present disclosure.

FIG. 11 is an exemplary front view of a thermoelectric element unit included in a thermoelectric module according to a seventh exemplary embodiment of the present disclosure. A thermoelectric module 7 according to a seventh exemplary embodiment of the present disclosure differs from the thermoelectric module 5 described above by having a different structure of the connection member 40. The connection member 40 may be an elastic clip 46 that connects the terminal parts 30a and 30b of the electrode 30 of any one thermoelectric element unit 10 with the terminal parts 30a and 30b of the electrode 30 of a different thermoelectric element unit 10 adjacent to any one thermoelectric element unit 10.

As illustrated in FIG. 11, an elastic clip 46 may include a first elastic hook 46a elastically coupled to the terminal parts 30a and 30b of the electrode 30 of any one thermoelectric element unit 10, a second elastic hook 46b elastically coupled to the terminal parts 30a and 30b of the electrode 30 of a different thermoelectric element unit 10, and a connecting part 46c electrically connecting the first elastic hook 46a and the second elastic hook 46b with each other. At least a portion of such an elastic clip 46 may be formed of a conductor to electrically connect the electrodes 30 with each other.

A pair of first elastic hooks 46a may be symmetrically formed with each other to be each elastically coupled to the first terminal part 30a and the second terminal part 30b of the electrode 30 of any one thermoelectric element unit 10. A pair of second elastic hooks 46b may be symmetrically formed with each other to each be elastically coupled to the first terminal part 30a and the second terminal part 30b of the electrode 30 of the different thermoelectric element unit 10. The connecting part 46c may be elongated along the width direction of the thermoelectric element 20 to electrically connect the first elastic hook 46a and the second elastic hook 46b with each other.

For example, an elastic clip 46, the elastic hooks 46a and 46b and the terminal parts 30a and 30b may be selectively elastic-coupled to each other. Therefore, the thermoelectric module 7 may remove the thermoelectric element unit 10 when an abnormality occurs from the thermoelectric module 7, or may additionally install a new thermoelectric element unit 10 in the thermoelectric module 7 by the separation and the coupling of the elastic hooks 46a and 46b and the terminal parts 30a and 30b. Thereby, the thermoelectric module 7 may improve convenience of maintenance and may more easily adjust the number of the thermoelectric element units 10 included in the thermoelectric module 7.

Figure 12:
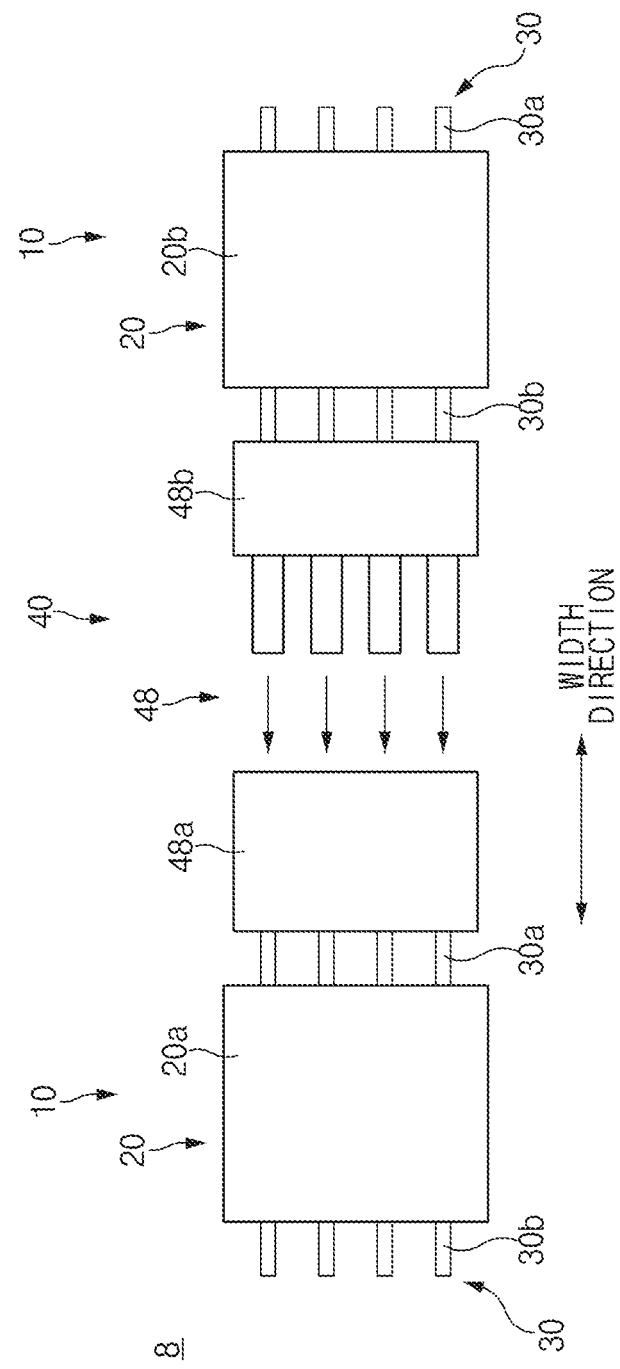
FIG. 12 is an exemplary plan view illustrating a coupling relationship between thermoelectric element units included in a thermoelectric module according to an eighth exemplary embodiment of the present disclosure.

FIG. 12 is an exemplary plan view illustrating a coupling relationship between thermoelectric element units included in a thermoelectric module according to an eighth exemplary embodiment of the present disclosure. A thermoelectric module 8 according to an eighth exemplary embodiment of the present disclosure differs from the thermoelectric module 5 described above by having a different structure of the connection member 40. The connection member 40 may be a connector 48 connecting the terminal parts 30a and 30b of the electrode 30 of any one thermoelectric element unit 10 with the terminal parts 30a and 30b of the electrode 30 of a different thermoelectric element unit 10 adjacent to any one thermoelectric element unit 10.

As illustrated in FIG. 12, such a connector 48 may include a female connector 48a mounted on the terminal parts 30a and 30b of the electrode 30 of any one thermoelectric element unit 10, and a male connector 48b mounted on the terminal parts 30a and 30b of the electrode 30 of a different thermoelectric element unit 10 and selectively coupled to the female connector 48a. For example, the female connector 48a may be mounted on any one of the first terminal part 30a and the second terminal part 30b of the electrode 30 of any one thermoelectric element unit 10, and the male connector 48b may be mounted on any one of the first terminal part 30a and the second terminal part 30b of the electrode 30 of a different thermoelectric element unit 10. For example, as illustrated in FIG. 12, the female connector 48a may be mounted on the first terminal part 30a of the electrode 30 of any other thermoelectric element unit 10, and the male connector 48b may be mounted on the second terminal part 30b of the electrode 30 of a different thermoelectric element unit 10.

By such a connector 48, the thermoelectric element units 10 may be selectively coupled to each other through the female connector 48a and the male connector 48b. Therefore, the thermoelectric module 8 may remove the thermoelectric element unit 10 when an abnormality occurs from the thermoelectric module 8, or may install a new thermoelectric element unit 10 in the thermoelectric module by the separation and the coupling of the female connector 48a and the male connector 48b. Accordingly, the thermoelectric module 8 may improve convenience of maintenance and may more easily adjust the number of the thermoelectric element units 10 included in the thermoelectric module 8.

Figure 13:
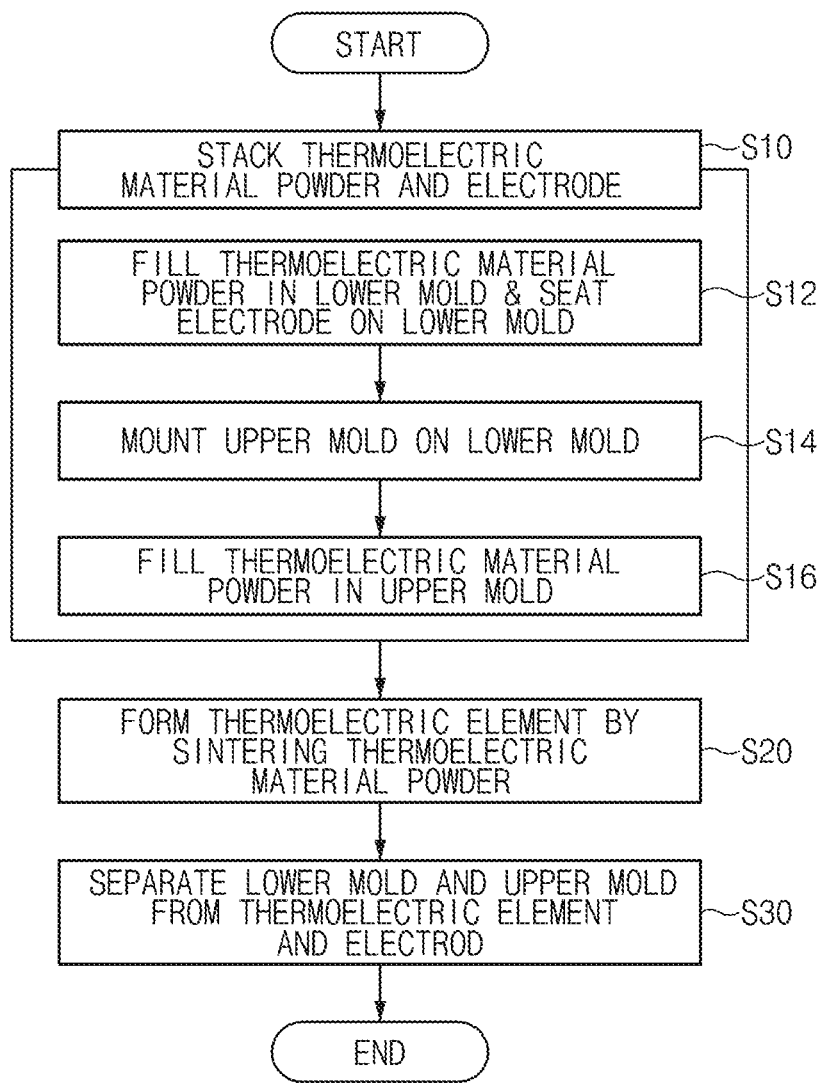
FIG. 13 is an exemplary flowchart illustrating a method for manufacturing a thermoelectric element unit according to a ninth exemplary embodiment of the present disclosure.
Figure 14:
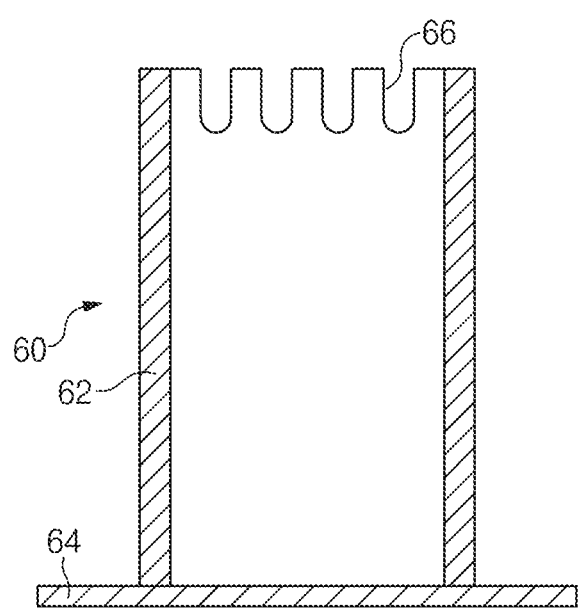
FIGS. 14 to 21 are exemplary views illustrating aspects of performing the respective operations illustrated in FIG. 13 according to an exemplary embodiment of the present disclosure.

FIG. 13 is an exemplary flowchart illustrating a method for manufacturing a thermoelectric element unit according to a ninth exemplary embodiment of the present disclosure and FIG. 14 is a view illustrating an aspect of performing the respective operations illustrated in FIG. 13. Referring to FIG. 13, a method for manufacturing the thermoelectric element unit 10 according to a ninth exemplary embodiment of the present disclosure may include an operation of stacking a thermoelectric material powder P and electrodes 30 to embed the electrodes 30 in the thermoelectric material powder P (S10), and an operation of forming a thermoelectric element 20 formed of a thermoelectric material sintered body formed by sintering the thermoelectric material powder P and having the electrodes 30 embedded therein (S20).

The stacking of a thermoelectric material powder P and electrodes 30 (S10) may include filling the thermoelectric material powder P in a lower mold 60 to a predetermined height and seating the electrodes 30 on predetermined positions of the lower mold 60 (S12), mounting an upper mold 70 on the lower mold 60 (S14), and filling the thermoelectric material powder P in the upper mold 70 to a predetermined height to embed the electrodes 30 in the thermoelectric material powder P (S16). The thermoelectric material powder P may be filled in the lower mold 60 to the predetermined height and the electrodes 30 may be held in holding grooves 66 of the lower mold 60 to be described below (S12).

As illustrated in FIG. 14, the lower mold 60 may include an outer wall 62 having a cylindrical shape and a cover sheet 64 closing a lower opening of the outer wall 62. The outer wall 62 may be formed of a graphite material and the cover sheet 64 may be formed of a carbon material, but are not limited thereto. One or more holding grooves 66 in which the electrodes 30 may each be held are formed in an upper end portion of the outer wall 62.

Figure 15:
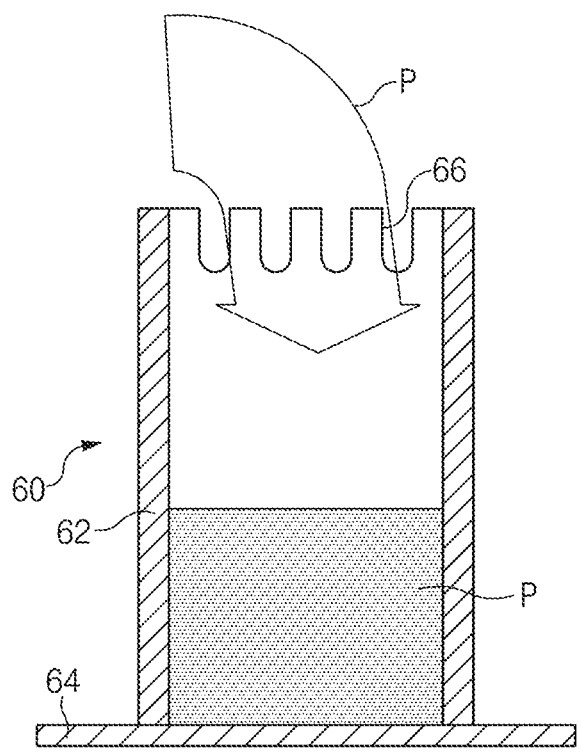
Figure 16:
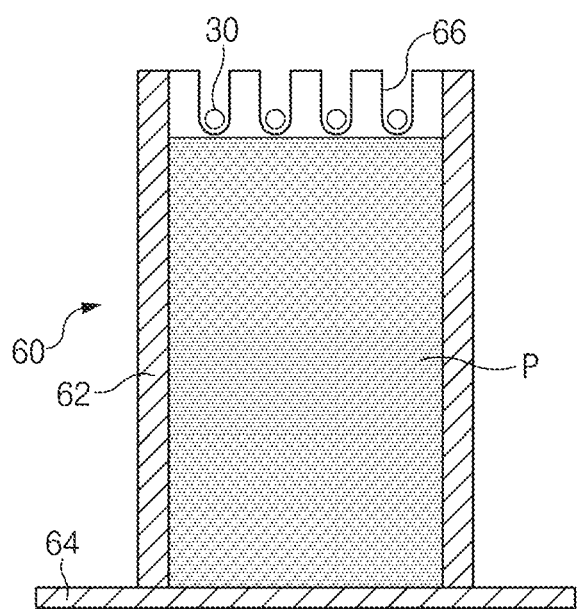

Each of the thermoelectric material powder P and the electrode 30 may be formed of a predetermined material to enable a sintering temperature of the thermoelectric material powder P to be less than a melting temperature of the electrode. As illustrated in FIG. 15, the thermoelectric material powder P may be filled in the lower mold 60 to a height corresponding to the lower end portion of the holding groove 66. As illustrated in FIG. 16, the electrode 30 may be seated in the lower mold 60 to maintain at least one end portion of opposite end portions thereof in the holding groove 66. The electrode 30 may be held in the holding groove 66 when the thermoelectric material powder P is filled in the lower mold 60, but is not limited thereto. In other words, after the position of the electrodes 30 are maintained in the holding grooves 66, the thermoelectric material powder P may be filled in the lower mold 60 through a gap between the electrodes 30. A a lower end portion of the upper mold 70 may be maintained on an upper end portion of the lower mold 60.

Figure 17:
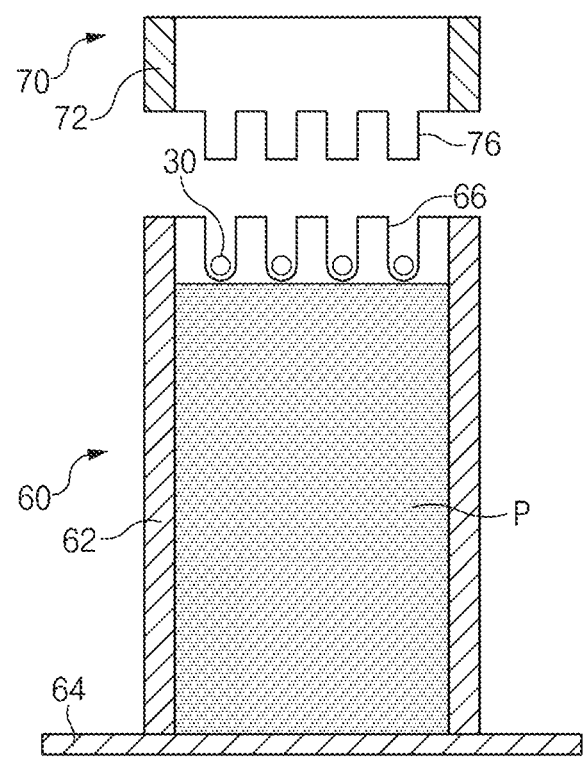
Figure 18:
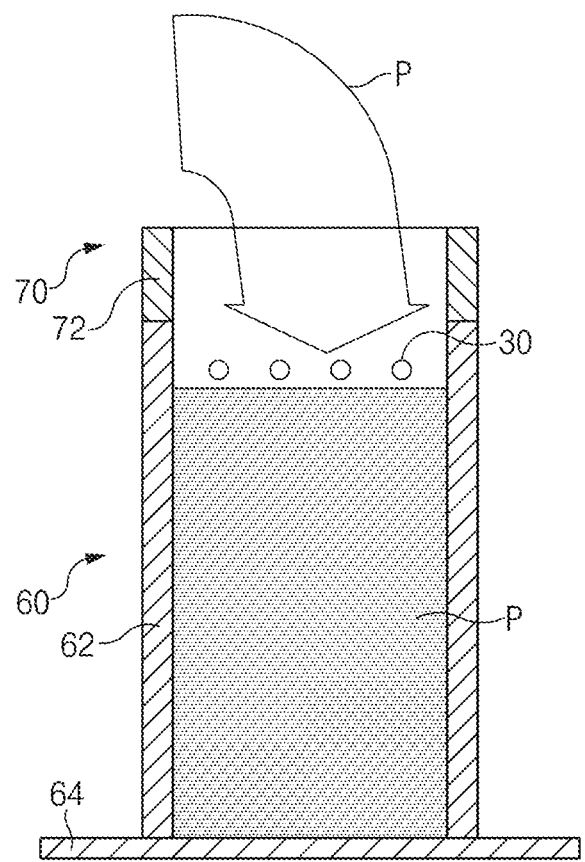
Figure 19:
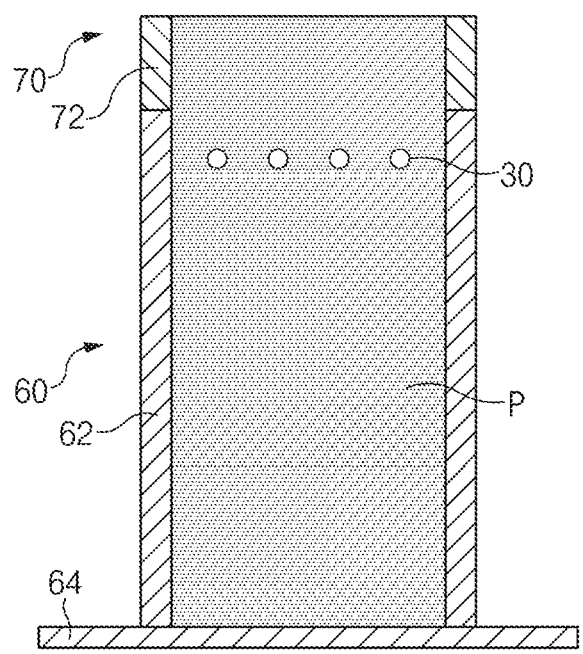
Figure 20:
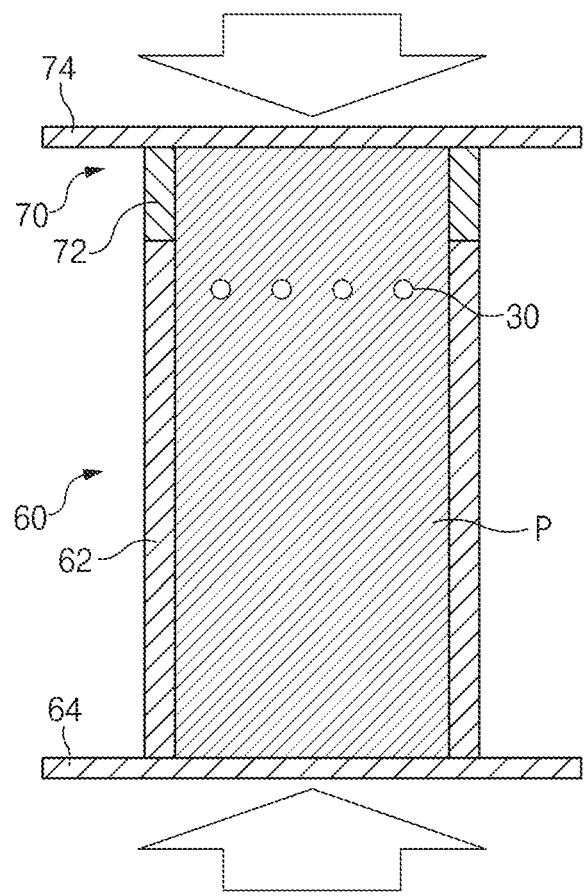

As illustrated in FIGS. 17 and 20, the upper mold 70 may include an outer wall 72 having a cylindrical shape and a cover sheet 74 closing an upper opening of the outer wall 72. The outer wall 72 may be formed of a graphite material and the cover sheet 74 may be a carbon material, but are not limited thereto. One or more fixing protrusions 76 selectively insertable into the holding grooves 66 may be formed on the lower end portion of the outer wall 72. As illustrated in FIG. 17, the mounting the lower end portion of the outer wall 72 on the upper end portion of the outer wall 62 may be performed to insert the fixing protrusions 76 into the holding grooves 66 (S14). Thereby, the fixing protrusions 76 may prevent the thermoelectric material powder P from being exposed to the exterior through the holding grooves 66 and compress and maintain the position of the electrodes 30 held in the holding grooves 66. The thermoelectric material powder P in the upper mole 70 may be filled (S16) as illustrated in FIG. 18. As illustrated in FIG. 19, the electrodes 30 may be embedded in the thermoelectric material powder P, and at least one end portion of the electrode 30 may be exposed to the exterior of the thermoelectric material powder P through the holding groove 66.

Further, the thermoelectric material powder P may be sintered in a state in which it is filled in the molds 60 and 70 (S20). As illustrated in FIG. 20, after the upper opening of the outer wall 72 is closed by using the cover sheet 74, the thermoelectric material powder P may be sintered. Further, the thermoelectric material powder P may be sintered at an ambient temperature greater than the sintering temperature of the thermoelectric material powder P and less than the melting temperature of the electrode 30 to prevent the electrode 30 from melting. When the thermoelectric material powder P is sintered as described above, the thermoelectric element unit 10 including the thermoelectric element 20 formed of the thermoelectric material sintered body and the electrodes 30 embedded in the thermoelectric element 20 may be formed.

Figure 21:
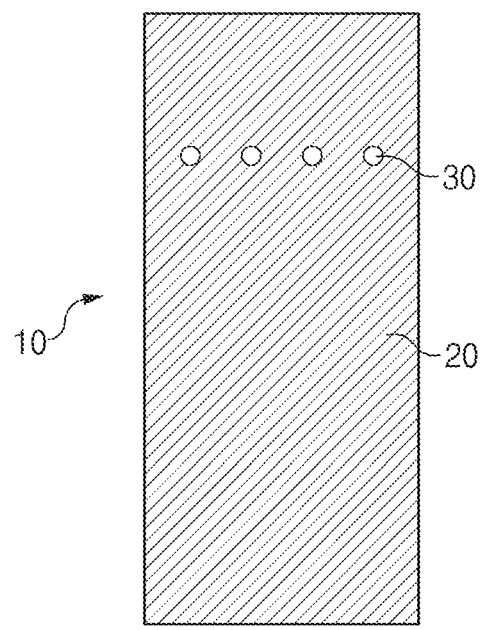

Further, as illustrated in FIGS. 13 and 21, the method for manufacturing the thermoelectric element unit 10 may further include of separating the molds 60 and 70 from the thermoelectric element 20 and the electrodes 30 (S30), for example, the thermoelectric element unit 10. As described above, the thermoelectric element unit, the thermoelectric module including the same, and the method for manufacturing the same may prevent the performance of the thermoelectric module from being deteriorated or damaged due to the thermal stress. Accordingly, the thermal stress between the thermoelectric element and the electrode may be reduced by embedding the electrode in the thermoelectric element without using the separate bonding material.

The spirit of the present disclosure has been merely exemplified. It will be appreciated by those skilled in the art that various modifications and alterations can be made without departing from the essential characteristics of the present disclosure. Accordingly, the exemplary embodiments disclosed in the present disclosure do not limit but describe the spirit of the present disclosure, and the scope of the present disclosure is not limited by the exemplary embodiments. The scope of the present disclosure should be construed by the following claims and it should be construed that all spirits equivalent to the following claims fall within the scope of the present disclosure.

What is claimed is:

1. A thermoelectric element unit, comprising:
a thermoelectric element; and
an electrode having a terminal part that protrudes to an exterior of the thermoelectric element and embedded in the thermoelectric element,
wherein the electrode is configured to slidably move along an interface between the thermoelectric element and the electrode in order to be thermally expanded independently of the thermoelectric element.

2. The thermoelectric element unit according to claim 1, wherein the electrode has a rod shape elongated in a length direction and is disposed to penetrate through the thermoelectric element along the length direction.

3. The thermoelectric element unit according to claim 1, wherein the thermoelectric element is formed from a thermoelectric material sintered body having a predetermined sintering temperature, and the electrode is formed of an electrode material having a melting temperature greater than the sintering temperature.

4. A thermoelectric module, comprising:
a plurality of thermoelectric elements; and
a plurality of electrodes slidably embedded in each of the thermoelectric elements by a predetermined number,
wherein at least one electrode of the plurality of electrodes includes a terminal part that protrudes to an exterior of the thermoelectric element in which the at least one electrode is embedded among the thermoelectric elements, and
wherein the electrodes are configured to slidably move along an interface between the thermoelectric element and the electrodes in order to be thermally expanded independently of the thermoelectric element.

5. The thermoelectric module according to claim 4, wherein each of the thermoelectric elements is formed from a thermoelectric material sintered body having a predetermined sintering temperature, and each of the electrodes is formed of an electrode material having a melting temperature greater than the sintering temperature.

6. The thermoelectric module according to claim 4, wherein when any one of the electrodes embedded in any one of the thermoelectric elements is referred to as a first electrode and any one of the electrodes embedded in any other one of the thermoelectric elements is referred to as a second electrode, the first and second electrodes are electrically connected to each other by a connection between the terminal part of the first electrode and the terminal part of the second electrode.

7. The thermoelectric module according to claim 6, further comprising: a connection member that electrically connects the terminal part of the first electrode with the terminal part of the second electrode.

8. The thermoelectric module according to claim 7, wherein the connection member includes a female connector mounted on the terminal part of the first electrode and a male connector mounted on the terminal part of the second electrode and selectively coupled to the female connector.

9. The thermoelectric module according to claim 7, wherein the connection member includes a first elastic hook elastically coupled to the terminal part of the first electrode, a second elastic hook elastically coupled to the terminal part of the second electrode, and a connecting part configured to electrically connect the first elastic hook and the second elastic hook with each other.

10. The thermoelectric module according to claim 4, wherein the electrodes embedded together in the same thermoelectric element among the thermoelectric elements are disposed to enable a portion of the electrodes to be in contact with each other.

11. The thermoelectric module according to claim 10, wherein the electrodes embedded together in the same thermoelectric element among the thermoelectric elements are disposed in a mesh shape.

12. The thermoelectric module according to claim 4, wherein each of the electrodes has a rod shape elongated in a length direction and is disposed to penetrate through the thermoelectric element in which the electrode is embedded among the thermoelectric elements in the length direction.

13. The thermoelectric module according to claim 4, further comprising: an insulating layer disposed on an exterior side surface of the thermoelectric elements.

\* \* \* \* \*